(12) United States Patent
Suzuki

(10) Patent No.: US 12,396,094 B2
(45) Date of Patent: Aug. 19, 2025

(54) CIRCUIT SUBSTRATE AND MODULE

(71) Applicant: Murata Manufacturing Co., Ltd., Kyoto (JP)

(72) Inventor: Hisashi Suzuki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 229 days.

(21) Appl. No.: 18/189,460

(22) Filed: Mar. 24, 2023

(65) Prior Publication Data

US 2023/0232531 A1 Jul. 20, 2023

Related U.S. Application Data

(63) Continuation of application No. PCT/JP2021/034828, filed on Sep. 22, 2021.

(30) Foreign Application Priority Data

Sep. 25, 2020 (JP) ................................ 2020-160822

(51) Int. Cl.
| | |
|---|---|
| H05K 1/11 | (2006.01) |
| H05K 1/02 | (2006.01) |
| H05K 1/03 | (2006.01) |
| H05K 1/18 | (2006.01) |

(52) U.S. Cl.
CPC .......... *H05K 1/111* (2013.01); *H05K 1/0271* (2013.01); *H05K 1/0306* (2013.01); *H05K 1/181* (2013.01); *H05K 2201/068* (2013.01)

(58) Field of Classification Search
CPC .... H05K 1/0271; H05K 1/0306; H05K 1/111; H05K 1/113; H05K 1/181; H05K 2201/068; H05K 3/28; H05K 3/284; H05K 2201/099; H05K 1/11; H05K 2201/098; H05K 2201/0979
USPC ........................................................ 361/760
See application file for complete search history.

(56) References Cited

U.S. PATENT DOCUMENTS

| | | | |
|---|---|---|---|
| 2007/0278670 A1 | 12/2007 | Kimura et al. | |
| 2009/0071700 A1 | 3/2009 | Matsubara | |
| 2012/0281375 A1* | 11/2012 | Hsu | .......... H01L 24/19 |
| | | | 361/761 |
| 2016/0307864 A1* | 10/2016 | Chiu | ................... H01L 23/3171 |
| 2019/0069402 A1* | 2/2019 | Takemori | ............. H05K 1/0271 |

(Continued)

FOREIGN PATENT DOCUMENTS

| | | |
|---|---|---|
| JP | 2004-014616 A | 1/2004 |
| JP | 4706929 B2 | 6/2011 |
| JP | 2017-152678 A | 8/2017 |

(Continued)

OTHER PUBLICATIONS

International Search Report for PCT/JP2021/034828 dated Nov. 22, 2021.

*Primary Examiner* — Timothy J Thompson
*Assistant Examiner* — Sidi M Maiga
(74) *Attorney, Agent, or Firm* — McDonald Hopkins LLC

(57) ABSTRACT

A circuit board 1 including: a substrate; an electrode pad on a surface of the substrate; and a projecting electrode on the electrode pad, wherein the electrode pad on which the projecting electrode is disposed is larger than the projecting electrode when viewed from above, and a coating layer covers at least a portion of an outer periphery of the electrode pad on which the projecting electrode is disposed.

17 Claims, 4 Drawing Sheets

(56) References Cited

U.S. PATENT DOCUMENTS

2021/0297057 A1* 9/2021 Iwamoto ................. H01L 25/18

FOREIGN PATENT DOCUMENTS

| WO | 2007/049458 A1 | 5/2007 |
| WO | 2008/004423 A1 | 1/2008 |

* cited by examiner

CIRCUIT SUBSTRATE AND MODULE

CROSS REFERENCE TO RELATED APPLICATION

This is a continuation of International Application No. PCT/JP2021/034828 filed on Sep. 22, 2021 which claims priority from Japanese Patent Application No. 2020-160822 filed on Sep. 25, 2020. The contents of these applications are incorporated herein by reference in their entireties.

BACKGROUND OF THE DISCLOSURE

Field of the Disclosure

The present disclosure relates to a circuit board and a module.

Description of the Related Art

An example circuit board includes a substrate, an electronic component mounted on the substrate, and projecting electrodes surrounding a portion where the electronic component is mounted on the substrate.

In Patent Literature 1, projecting electrodes are disposed on an electrode pad.

PATENT LITERATURE

Patent Literature 1: JP 4706929 B

BRIEF SUMMARY OF THE DISCLOSURE

When projecting electrodes are disposed on an electrode pad having a relatively large area as disclosed in Patent Literature 1, impact such as thermal impact or drop impact applied to the circuit board sometimes causes separation of the electrode pad at its outer periphery from the circuit board.

The separation easily occurs by impact particularly when the electrode pad is at a corner of the circuit board when viewed from above.

The present disclosure is made to solve the above issue and aims to provide a circuit board configured such that an electrode pad on which a projecting electrode is disposed is not easily separated by impact, and a module including the circuit board.

A circuit board of the present disclosure includes: a substrate; an electrode pad on a surface of the substrate; and a projecting electrode on the electrode pad, wherein the electrode pad on which the projecting electrode is disposed is larger than the projecting electrode when viewed from above, and a coating layer covers at least a portion of an outer periphery of the electrode pad on which the projecting electrode is disposed.

A module of the present disclosure includes the circuit board of the present disclosure; an electronic component mounted on the circuit board; and a molding resin sealing a periphery of the circuit board and the electronic component, wherein the projecting electrode is exposed on a top surface of the molding resin.

The present disclosure provides a circuit board configured such that an electrode pad on which projecting electrode is disposed is not easily separated by impact, and a module including the circuit board.

DETAILED DESCRIPTION OF THE DISCLOSURE

Hereinafter, the circuit board of the present disclosure is described.

The present disclosure is not limited to the following preferred embodiments and may be suitably modified without departing from the gist of the present disclosure. Combinations of two or more preferred features described in the following preferred embodiments are also within the scope of the present disclosure.

Figure 1:
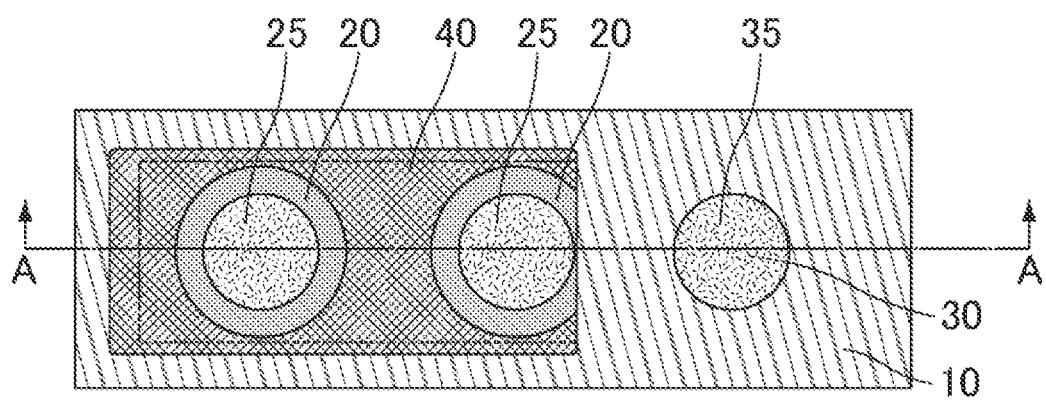
FIG. 1 is a schematic top view of electrode pads, projecting electrodes, and a coating layer on a surface of a substrate.
Figure 2:
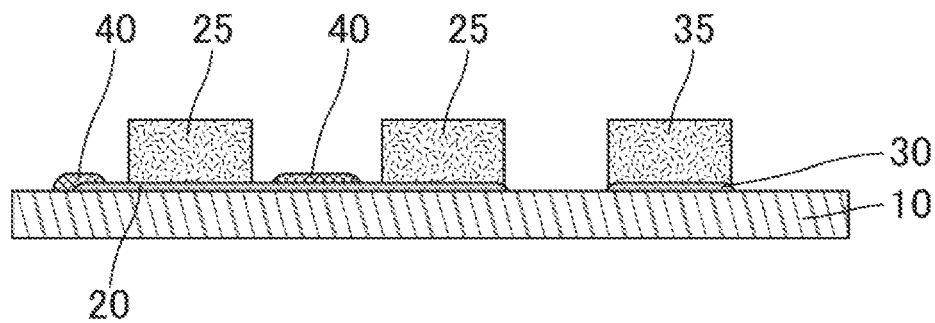
FIG. 2 is a cross-sectional view taken along line A-A in FIG. 1.

FIG. 1 is a schematic top view of electrode pads, projecting electrodes, and a coating layer on a surface of a substrate. FIG. 2 is a cross-sectional view taken along line A-A in FIG. 1.

The circuit board of the present disclosure includes a substrate; an electrode pad on a surface of the substrate; a projecting electrode on the electrode pad; and a coating layer.

FIG. 1 and FIG. 2 each show two different embodiments of projecting electrodes, one on the left and one on the right, on a surface of a substrate 10.

FIG. 1 and FIG. 2 each show, on the left, an embodiment in which projecting electrodes 25 are disposed on an electrode pad 20. The electrode pad 20 is an electrode larger than each projecting electrode 25 when viewed from above. Two projecting electrodes 25 are disposed on the electrode pad 20. Since the electrode pad 20 is larger than each projecting electrode 25, the electrode pad 20 includes a portion extending on the surface of the substrate 10, without being hidden by the projecting electrodes 25.

In the circuit board of the present disclosure, a coating layer covers at least a portion of an outer periphery of the electrode pad on which the projecting electrode is disposed.

FIG. 1 and FIG. 2 each show a coating layer 40 covering at least a portion of the outer periphery of the electrode pad 20. Since the electrode pad 20 is hidden by the coating layer 40, the outer periphery of the electrode pad 20 is indicated by dotted lines. The coating layer 40 extends to the outside of the dotted lines.

As described above, when a projecting electrode is disposed on the electrode pad having a relatively large area, the electrode pad may be separated from the circuit board at its outer periphery when impact is applied to the circuit board. Covering the outer periphery of the electrode pad by the coating layer can prevent separation of the electrode pad at its outer periphery.

The electrode pad covered by the coating layer has a relatively large area. When the electrode pad whose portion extending without being hidden by the projecting electrode(s) is rather large, the electrode pad can be easily separated at its outer periphery by impact. In this viewpoint, the maximum length from the projecting electrode to the outer periphery of the electrode pad before being covered by the coating layer may be 30 μm or more, when the circuit board is viewed from above. Under such condition, the effect of the coating layer is effectively exerted.

In the embodiment shown in FIG. 1 and FIG. 2, a coating layer 40 does not cover the entire electrode pad 20 exposed on the surface of the substrate 10. The electrode pad 20 is exposed around the projecting electrodes 25. This reflects the fact that such a positional relationship is common because it is preferred in the circuit board production process that the projecting electrodes are disposed after formation of coating layers that cover the electrode pads.

FIG. 1 and FIG. 2 each show, on the right, an embodiment in which a projecting electrode 35 is disposed on an electrode pad 30. The electrode pad 30 is an electrode pad having the same shape as that of the projecting electrode 35 when viewed from above, and one projecting electrode 35 is disposed on the electrode pad 30.

The electrode pad 30 and the projecting electrode 35 have the same shape when viewed from above. Thus, the electrode pad 30 is hidden by the projecting electrode 35 on the surface of the substrate 10, and the electrode pad 30 has no exposed portion. Thus, the electrode pad 30 will not be separated at its outer periphery, and no coating layer is needed thereon.

In the circuit board, the ground electrode pad connected to the ground is usually a large electrode pad as shown on the left of FIG. 1 and FIG. 2. Multiple projecting electrodes are usually disposed on the ground electrode pad as shown on the left of FIG. 1 and FIG. 2.

In other words, the electrode pad to be covered by the coating layer is preferably a ground electrode pad.

In addition, a signal electrode pad that serves as a signal terminal in the circuit board is usually an electrode pad having the same area as that of the projecting electrode as shown on the right of FIG. 1 and FIG. 2. In other words, no coating layer is usually needed on the signal electrode pad.

Preferably, the substrate defining the circuit board of the present disclosure is a ceramic substrate.

Preferably, the ceramic substrate is a low temperature co-fired ceramic substrate (LTCC substrate).

The low temperature co-fired ceramic material is a ceramic material that can be sintered at a temperature of 1000° C. or lower and that can be co-fired with low resistive Au, Ag, Cu, or the like. Specific examples of the low temperature co-fired ceramic material include glass composite-based low-temperature co-fired ceramic materials in which ceramic powder such as alumina, zirconia, magnesia, or forsterite is mixed with borosilicate glass; crystallized glass-based low-temperature co-fired ceramic materials containing ZnO—MgO—$Al_2O_3$—$SiO_2$-based crystallized glass; and non-glass low-temperature co-fired ceramic materials containing a BaO—$Al_2O_3$—$SiO_2$-based ceramic powder or a $Al_2O_3$—CaO—$SiO_2$—MgO—$B_2O_3$-based ceramic powder.

In addition to the ceramic substrate, a resin substrate can also be used as the substrate defining the circuit board of the present disclosure. Examples of the resin substrate include a paper phenol substrate, a glass epoxy substrate, a bismaleimide-triazine (BT) resin substrate, and a polyimide resin substrate.

The electrode pad can be one obtained by forming a pattern by a technique such as screen printing or photolithography using a conductive paste.

The conductive paste contains, for example, a conductive metal powder, a binder, and a plasticizer. A co-base material (ceramic powder) for adjusting the shrinkage rate may be added to the conductive paste. Examples of conductive metal materials contained in the conductive paste include metals containing at least one of Ag, a Ag—Pt alloy, a Ag—Pd alloy, Cu, Ni, Pt, Pd, W, Mo, and Au as a main component. Among these conductive metal materials, Ag, a Ag—Pt alloy, a Ag—Pd alloy, and Cu are more preferably used particularly for conductive patterns for high frequency applications because these materials have low resistivity.

The thickness of the electrode pad is preferably 20 μm or more and 30 μm or less, for example.

The coating layer defining the circuit board of the present disclosure can be a ceramic coating layer containing a ceramic material or a solder resist layer.

When the substrate is a ceramic substrate, preferably, a ceramic material contained in a ceramic coating layer is co-fired with a ceramic material of the ceramic substrate.

When the coating layer is a ceramic coating layer, preferably, the substrate is also a ceramic substrate. When the coating layer and the substrate are both made of a ceramic material, adhesiveness is good between the substrate and the coating layer, and their thermal expansion coefficients are close so that the substrate and the coating layer are not easily separated from each other.

Preferably, the ceramic material of the coating layer is the same as the ceramic material of the ceramic substrate.

The ceramic coating layer can be a ceramic coating layer containing the low temperature co-fired ceramic material described above. Alternatively, a raw material powder mixture obtained by adding an appropriate amount of alumina ($Al_2O_3$) powder to the low temperature co-fired ceramic material and mixing is dispersed in an organic vehicle and kneaded together to produce a ceramic paste for forming ceramic coating layers, and the ceramic paste is applied and dried to produce a ceramic coating layer. Such a ceramic coating layer can also be used.

When the ceramic coating layer contains a low temperature co-fired ceramic material and alumina, the thermal expansion coefficient of the surface of the ceramic substrate made of a low temperature co-fired ceramic material can be matched to the thermal expansion coefficient of the ceramic coating layer. In particular, when an alumina component derived from an alumina constraining layer is present on the surface of the ceramic substrate, the thermal expansion coefficient of the ceramic substrate can be better matched to the thermal expansion coefficient of the ceramic coating layer, owing to the presence of alumina in the ceramic coating layer.

When the ceramic coating layer contains a low temperature co-fired ceramic material and alumina, the amount of alumina added to the low temperature co-fired ceramic material is preferably 2 wt % or more and 15 wt % or less per total amount of the low temperature co-fired ceramic material and alumina.

Alternatively, a raw material powder mixture obtained by adding an appropriate amount of glass powder to the low temperature co-fired ceramic material and mixing is dispersed in an organic vehicle and kneaded together to produce a ceramic paste for forming ceramic coating layers, and the ceramic paste is applied and dried to produce a ceramic coating layer. Such a ceramic coating layer can also be used.

The presence of the low temperature co-fired ceramic material and the glass in the ceramic coating layer can prevent cracking of the ceramic coating layer. The presence thereof can also improve the plating resistance of the ceramic coating layer.

When the ceramic coating layer contains a low temperature co-fired ceramic material and glass, preferably, the ceramic material in the ceramic coating layer has a higher $SiO_2$ content by 5 wt % or more and 15 wt % or less and a lower BaO content by 5 wt % or more and 15 wt % or less than the ceramic material of the ceramic substrate.

The ceramic material contained in the ceramic coating layer and the low temperature co-fired ceramic material of the low temperature co-fired ceramic substrate may have the same composition.

The ceramic material contained in the ceramic coating layer may contain a low temperature co-fired ceramic material of the low temperature co-fired ceramic substrate, alumina, and glass.

The coating layer defining the circuit board of the present disclosure can be a solder resist layer made of a material used as a solder resist.

When the coating layer is a solder resist layer, preferably, the substrate is a resin substrate. The substrate may be a ceramic substrate, and the coating layer may be a solder resist layer. The substrate may be a low temperature co-fired ceramic substrate, and the coating layer may be a solder resist layer.

The thickness of the coating layer is preferably, for example, 20 μm or more and 30 μm or less.

The overlapping range between the coating layer and the electrode pad at the outer periphery of the electrode pad is preferably 30 μm or more and 200 μm or less.

The effect of the coating layer to prevent the separation of the electrode pad can be improved by bringing the thermal expansion coefficient of the coating layer closer to the thermal expansion coefficient of the substrate.

When the ceramic coating layer contains a low temperature co-fired ceramic material of the low temperature co-fired ceramic substrate and alumina, the thermal expansion coefficient of the ceramic coating layer can be adjusted by adjusting the amount of alumina powder to be added during production of a ceramic paste for forming ceramic coating layers. Preferably, the following relationship is satisfied as a result of the adjustment: $\alpha_3 < \alpha_1 < \alpha_2$, where $\alpha_1$ is the thermal expansion coefficient of the substrate, $\alpha_2$ is the thermal expansion coefficient of the electrode pad, and $\alpha_3$ is the thermal expansion coefficient of the ceramic coating layer. For example, preferably, the thermal expansion coefficient $\alpha_1$ of the substrate is 10 ppm/° C.; the thermal expansion coefficient $\alpha_2$ of the electrode pad is 16 ppm/° C.; and the thermal expansion coefficient $\alpha_3$ of the ceramic coating layer is 9 ppm/° C.

The projecting electrodes of the circuit board of the present disclosure are not limited, and any electrodes made of a conductive material and electrically connectable to the electrode pads can be used.

Preferably, the shape of each projecting electrode is cylindrical, with a diameter of 70 μm or more and 600 μm or less and a height of 20 μm or more and 500 μm or less.

Preferably, the aspect ratio (height/diameter) thereof is 7 or more and 25 or less.

The projecting electrode on the ground electrode pad and the projecting electrode on the signal electrode pad may have the same shape or different shapes.

Subsequently, preferred embodiments of the circuit board of the present disclosure are described.

Figure 3:
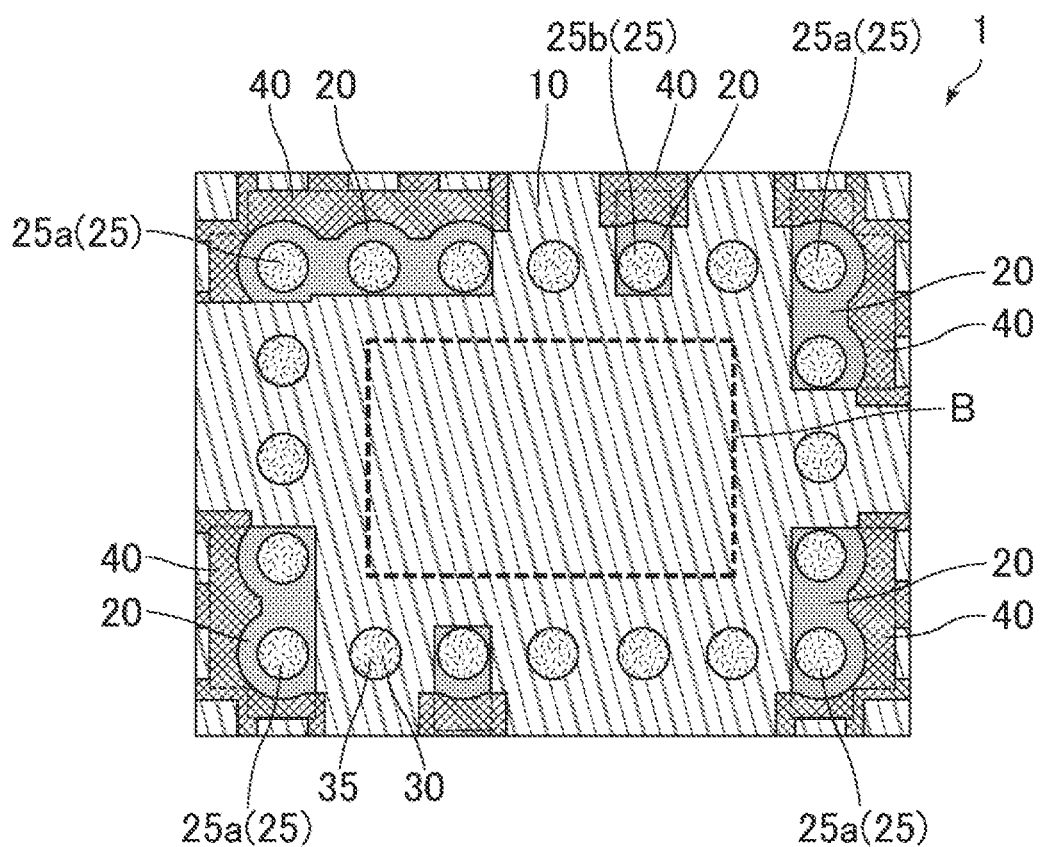
FIG. 3 is a schematic top view of an example of a circuit board according to an embodiment.

FIG. 3 is a schematic top view of an example of the circuit board according to an embodiment.

In a circuit board 1 shown in FIG. 3, there is a region (a region B surrounded by dotted lines in FIG. 3) for mounting an electronic component at a central portion of the substrate 10, and the region is surrounded by the electrode pads and the projecting electrodes. The region for mounting an electronic component includes an electronic component mounting land (not shown).

Examples of the electronic component to be mounted on the substrate include ICs, filters, capacitors, and inductors.

Preferably, a height of the electronic component to be mounted is lower than that of the projecting electrode.

The substrate 10 includes the electrode pads 20 as the ground electrode pads, and the electrode pads 30 as the signal electrode pads.

The projecting electrode(s) 25 is disposed on each electrode pad 20 as the ground electrode pad. The electrode pad 20 is larger than the projecting electrode(s) 25 when viewed from above, so that the electrode pad 20 includes an exposed portion not hidden by the projecting electrode(s) 25.

When each ground electrode pad is made larger to improve its strength and is connected to a shield electrode at an outer peripheral portion, the ground can be reinforced.

The coating layers 40 are between the outer periphery of the circuit board and the projecting electrodes, when the circuit board is viewed from above. In other words, the coating layers 40 are disposed more outside than the projecting electrodes 25 are.

The electrode pads on the outer peripheral side of the circuit board can easily be separated by impact, so that disposing the coating layers on the outer peripheral side is more effective in preventing the separation of the electrode pads.

The coating layers may cover the outer periphery of the circuit board.

An electronic component is mounted at a central portion of the substrate. When the ground electrode pads are near or at the central portion of the substrate, the distance from the component mounting land electrode is short, possibly causing interference. Thus, the electrode pads at the outer peripheral portion of the substrate are made large, and the coating layers are disposed thereon.

The coating layer 40 covers the electrode pad disposed at a corner of the circuit board when the circuit board is viewed from above.

Four projecting electrodes denoted by reference sign 25a in FIG. 3 are the projecting electrodes at the four corners of the circuit board when viewed from above.

The electrode pads at the corners of the circuit board can particularly easily be separated by impact. Thus, disposing the coating layers at the corners is particularly effective in preventing the separation of the electrode pads.

Preferably, multiple projecting electrodes 25 are disposed on one electrode pad 20. It is because in the case where the electrode pad 20 is a ground electrode pad, even when one projecting electrode is disconnected, the connection can still be maintained with the remaining projecting electrode(s), as long as multiple projecting electrodes are disposed on one ground electrode pad.

One projecting electrode 25 may be disposed on one electrode pad 20. The projecting electrodes denoted by reference sign 25b in FIG. 3, one on top and one on bottom of FIG. 3, are each a projecting electrode on one electrode pad.

The projecting electrode 35 is disposed on each electrode pad 30 as the signal electrode pad. Each electrode pad 30 is an electrode pad having the same shape as each projecting electrode 35 when viewed from above, and one projecting electrode 35 is disposed on the electrode pad 30.

The electrode pads 30 are not covered by the coating layer.

FIG. 3 shows an embodiment in which there is a region for mounting an electronic component at a central portion of the substrate 10, and the region is surrounded by the electrode pads and the projecting electrodes. However, in the embodiment, the positions of the electrode pads and the projecting electrodes in the circuit board of the present disclosure are not limited, and the electrode pads and the projecting electrodes may be at a central portion of the substrate.

Figure 4:
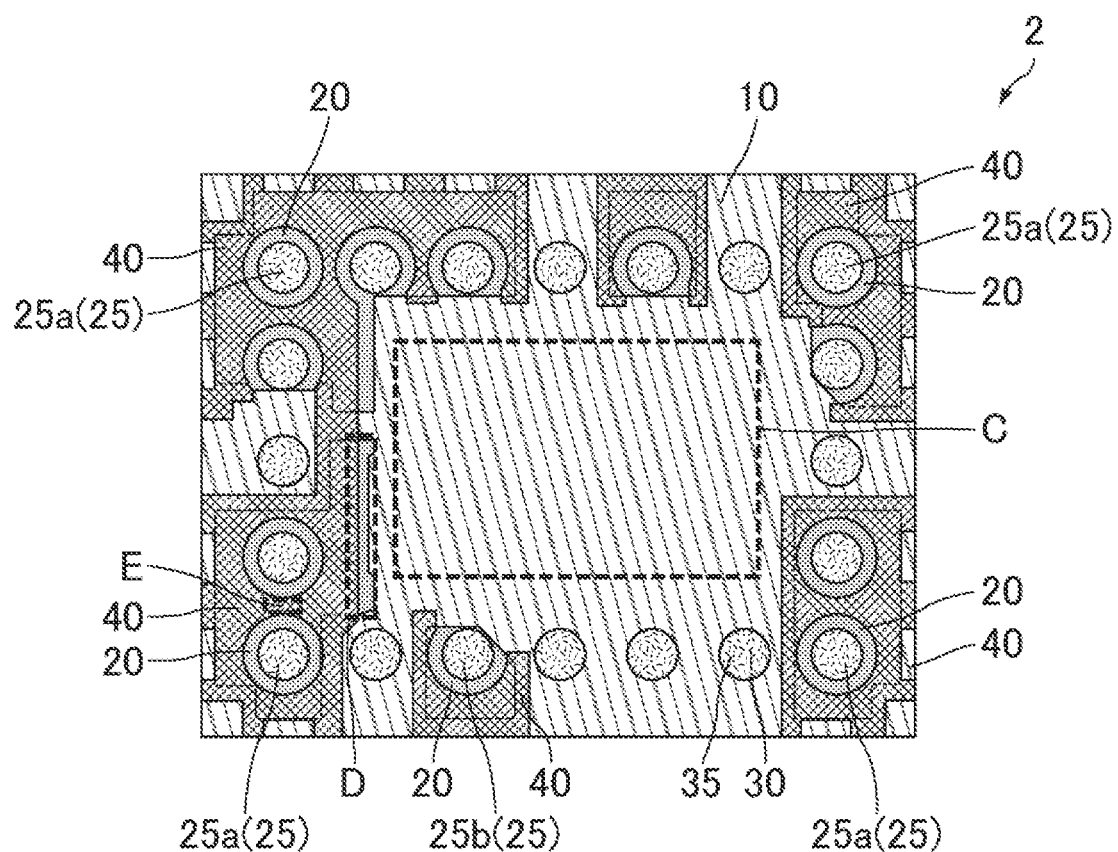
FIG. 4 is a schematic top view of another example of the circuit board according to an embodiment.

FIG. 4 is a schematic top view of another example of the circuit board according to an embodiment.

A circuit board 2 shown in FIG. 4 also includes a region (a region C surrounded by dotted lines in FIG. 4) for mounting an electronic component at a central portion of the substrate 10, and the region is surrounded by the electrode pads and the projecting electrodes. The region for mounting an electronic component includes an electronic component mounting land (not shown).

The following describes features different from those of the circuit board according to the embodiment shown in FIG. 3.

In the circuit board 2 shown in FIG. 4, when the circuit board 2 is viewed from above, the electrode pads 20 as the ground electrode pads extend more inside of the circuit board 2 than the projecting electrodes 25 are. The coating layers 40 are more inside of the circuit board 2 than the projecting electrodes 25 are.

In the circuit board, the total area of the electrode pads exposed on the front surface of the substrate is preferably equivalent to the total area of the electrode pads exposed on the rear surface of the substrate, in order to prevent substrate warpage. However, when the electrode pads extend more inside of the circuit board than the projecting electrodes are, the electrode pads with increased size may cause warpage in the circuit board. Thus, the coating layers are also disposed on the surfaces of the electrode pads extending more inside of the circuit board the than the projecting electrodes are, so that the total area of the electrode pads exposed on the front surface of the substrate is reduced, whereby the warpage of the substrate can be prevented.

In a portion indicated as a region D surrounded by dotted lines in FIG. 4, the outer periphery of the electrode pad is not covered by the coating layer and is exposed on the side closer to the inside of the circuit board. However, unlike the electrode pads on the outer peripheral side of the circuit board, the electrode pads in this region are not easily separated at their outer peripheries, so that the outer peripheries of the electrode pads may be exposed in this region.

In the circuit board 2 shown in FIG. 4, the coating layer 40 is disposed between adjacent projecting electrodes 25 when the circuit board 2 is viewed from above.

In FIG. 4, the region where the coating layer 40 is disposed between the adjacent projecting electrodes 25 is indicated as a region E surrounded by dotted lines.

The coating layer is disposed on the electrode pads exposed between the adjacent projecting electrodes, whereby the total area of the electrode pads exposed on the front surface of the substrate can be reduced. Thus, the warpage of the substrate can be prevented.

When one projecting electrode 25*b* is disposed on one electrode pad 20, the projecting electrode 25*b* and the electrode pad 20 may be asymmetrical in shape.

The shape of each projecting electrode 25*b* shown in FIG. 4 is round when viewed from above. In contrast, portions of the electrode pads 20 are cut on the side closer to the inside of the circuit board 2.

The coating layers 40 are disposed on the outer peripheries of the electrode pads 20, on the side closer to the outer periphery of the circuit board 2 than the projecting electrodes 25*b* are.

The module of the present disclosure includes the circuit board of the present disclosure; an electronic component mounted on the circuit board; and a molding resin sealing a periphery of the circuit board and the electronic component, wherein the projecting electrode is exposed on a top surface of the molding resin.

Figure 5:
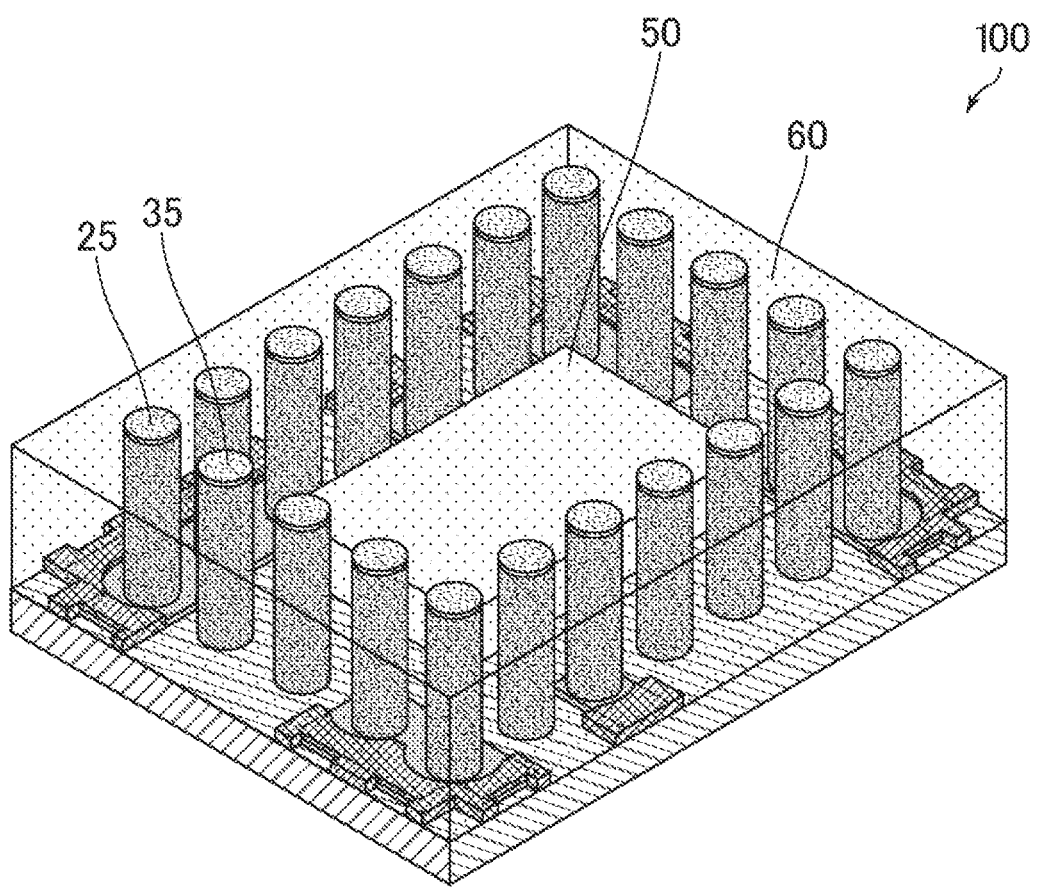
FIG. 5 is a schematic perspective view of a module including a circuit board and an electronic component mounted thereon, which is molded by a resin.

FIG. 5 is a schematic perspective view of a module including a circuit board and an electronic component mounted thereon, which is molded by a resin.

FIG. 5 shows a module 100 including an electronic component 50 mounted at a central portion of the circuit board 1 shown in FIG. 3, which is sealed by a molding resin 60. Top surfaces of the projecting electrodes 25 and the projecting electrodes 35 are exposed on a top surface of the molding resin 60, so that the projecting electrodes 25 and the projecting electrodes 35 of the circuit board 1 can be electrically connected to the outside on the top surface of the molding resin 60.

The projecting electrodes 25 and the projecting electrodes 35 are designed to be higher than the electronic component 50.

The electronic component 50 may be at least one selected from the group consisting of an IC, a filter, a capacitor, and an inductor.

In the module sealed by the molding resin as described above, when the module is subjected to thermal impact, stress may be applied to the outer peripheries of the electrode pads due to the difference in thermal expansion coefficient between the molding resin and the substrate. However, the separation of the electrode pads by thermal impact can be prevented by disposing the coating layers at the outer peripheries of the electrode pads.

1, 2 circuit board
10 substrate
20 electrode pad (ground electrode pad)
25 projecting electrode
25*a* projecting electrodes disposed at four corners when viewed from above
25*b* projecting electrode disposed on one electrode pad
30 electrode pad (signal electrode pad)
35 projecting electrode
40 coating layer
50 electronic component
60 molding resin
100 module

The invention claimed is:
1. A circuit board comprising:
a substrate;
at least one electrode pad on a surface of the substrate; and
at least one projecting electrode on the electrode pad,
wherein the electrode pad on which the projecting electrode is disposed is larger than the projecting electrode when viewed from above,
the circuit board further comprises a coating layer covering at least a portion of an outer periphery of the electrode pad on which the projecting electrode is disposed, the electrode pad has a portion exposed without being covered by the coating layer when the electrode pad is viewed from above, and the coating layer covers the electrode pad disposed at a corner of the circuit board when the circuit board is viewed from above.

2. The circuit board according to claim 1,
wherein the at least one projecting electrode comprises multiple projecting electrodes, and
the multiple projecting electrodes are disposed on one of the at least one electrode pad.

3. The circuit board according to claim 1,
wherein each electrode pad covered by the coating layer is a ground electrode pad.

4. The circuit board according to claim 1,
wherein the coating layer is disposed between an outer periphery of the circuit board and the projecting electrode when the circuit board is viewed from above.

5. The circuit board according to claim 1,
wherein the at least one projecting electrode comprises multiple projecting electrodes, and
wherein the coating layer is disposed between adjacent projecting electrodes among the multiple projecting electrodes when the circuit board is viewed from above.

6. The circuit board according to claim 1,
wherein on each electrode pad, the coating layer is disposed more inside of the circuit board than the projecting electrode is when the circuit board is viewed from above.

7. The circuit board according to claim 1,
wherein the substrate is a ceramic substrate.

8. The circuit board according to claim 1,
wherein the coating layer is a ceramic coating layer.

9. The circuit board according to claim 1,
wherein the coating layer is a ceramic coating layer, the ceramic substrate is a low temperature co-fired ceramic substrate, and the ceramic coating layer contains a low temperature co-fired ceramic material of the low temperature co-fired ceramic substrate and alumina.

10. The circuit board according to claim 1,
wherein the coating layer is a ceramic coating layer, the ceramic substrate is a low temperature co-fired ceramic substrate, and the ceramic coating layer contains a low temperature co-fired ceramic material of the low temperature co-fired ceramic substrate and glass.

11. A module comprising:
the circuit board according to claim 1;
an electronic component mounted on the circuit board; and
a molding resin sealing a periphery of the circuit board and the electronic component,
wherein the projecting electrode is exposed on a top surface of the molding resin.

12. The circuit board according to claim 7,
wherein the ceramic substrate is a low temperature co-fired ceramic substrate.

13. The module according to claim 11,
wherein the electronic component is at least one selected from the group consisting of an IC, a filter, a capacitor, and an inductor.

14. The module according to claim 11,
wherein the projecting electrode is higher than the electronic component.

15. The circuit board according to claim 2,
wherein each of the at least one electrode pad covered by the coating layer is a ground electrode pad.

16. The circuit board according to claim 2,
wherein the coating layer is disposed between an outer periphery of the circuit board and the projecting electrode when the circuit board is viewed from above.

17. The circuit board according to claim 3,
wherein the coating layer is disposed between an outer periphery of the circuit board and the projecting electrode when the circuit board is viewed from above.

\* \* \* \* \*